United States Patent [19]
Matsutomo

[11] Patent Number: 6,124,642
[45] Date of Patent: Sep. 26, 2000

[54] LEAD STRUCTURE FOR A SEMICONDUCTOR DEVICE WITH AN ISOLATING PROTECTIVE LAYER AND METHOD OF FABRICATING THE SAME

[75] Inventor: Mitsuhiro Matsutomo, Kumamoto, Japan

[73] Assignee: NEC Corporation, Tokyo, Japan

[21] Appl. No.: 08/979,254

[22] Filed: Nov. 26, 1997

[30] Foreign Application Priority Data

Nov. 28, 1996  [JP]  Japan .................................. 8-317596

[51] Int. Cl.$^7$ .............................. H01L 23/50; H01L 21/52
[52] U.S. Cl. ......................... 257/767; 257/666; 257/769; 257/753; 257/766; 257/768; 257/698; 257/671
[58] Field of Search ........................... 257/666, 668–677, 257/696, 698, 787, 642, 753, 764, 766, 768, 769, 767

[56] References Cited

U.S. PATENT DOCUMENTS

| | | | |
|---|---|---|---|
| 4,125,441 | 11/1978 | Dugan | 205/78 |
| 4,141,782 | 2/1979 | Dugan et al. | 29/625 |
| 4,715,235 | 12/1987 | Fukui et al. | 73/775 |
| 4,756,080 | 7/1988 | Thorp, Jr. et al. | 29/827 |
| 4,837,184 | 6/1989 | Lin et al. | 257/701 |
| 4,974,057 | 11/1990 | Tazima | 257/786 |
| 4,997,517 | 3/1991 | Parthasarathi | 216/18 |
| 5,049,718 | 9/1991 | Spletter et al. | 219/121.64 |
| 5,067,005 | 11/1991 | Michii et al. | 257/712 |
| 5,069,626 | 12/1991 | Patterson et al. | 257/779 |
| 5,134,460 | 7/1992 | Brady et al. | 257/733 |
| 5,173,766 | 12/1992 | Long et al. | 257/687 |
| 5,227,232 | 7/1993 | Lim | 428/344 |
| 5,229,329 | 7/1993 | Chai et al. | 29/827 |
| 5,268,331 | 12/1993 | Abbott | 257/671 |
| 5,276,351 | 1/1994 | Yamazaki et al. | 257/666 |
| 5,326,990 | 7/1994 | Mita et al. | 257/672 |
| 5,343,073 | 8/1994 | Parthasarathi et al. | 257/664 |
| 5,508,401 | 4/1996 | Segawa et al. | 250/208.1 |
| 5,608,260 | 3/1997 | Carper et al. | 257/669 |
| 5,659,198 | 8/1997 | Okutoho et al. | 257/659 |
| 5,723,900 | 3/1998 | Kojima et al. | 257/666 |
| 5,737,191 | 4/1998 | Horiuchi et al. | 257/697 |
| 5,793,099 | 8/1998 | Murukami et al. | 257/666 |

FOREIGN PATENT DOCUMENTS

8-204098  8/1996  Japan .
8-204111  8/1996  Japan .

Primary Examiner—Alexander O. Williams
Attorney, Agent, or Firm—Young & Thompson

[57] ABSTRACT

A lead structure is provided in a semiconductor device, having a body of a lead having at least a part of which is in contact with an adhesive which bonds with an insulation tape, and a protection layer selectively provided on the body of the lead so that the protection layer coats at least the part of the body in contact with the adhesive to completely isolate the body of the lead from the adhesive, to prevent an ion migration of a material of the body and also to prevent leakage of currents from and into the body of the lead.

9 Claims, 6 Drawing Sheets

1 : lead
2 : insulation tape
3 : adhesive
4 : metal plating layer

FIG. 1A  prior art

1 : lead
2 : insulation tape

FIG. 1B  prior art

1 : lead
2 : insulation tape
3 : adhesive

FIG. 2A

1 : lead
2 : insulation tape
4 : metal plating layer

FIG. 2B

1 : lead
2 : insulation tape
3 : adhesive
4 : metal plating layer

FIG. 3A

1 : lead
2 : insulation tape
5 : coating resin layer

FIG. 3B

1 : lead
2 : insulation tape
3 : adhesive
5 : coating resin layer

LEAD STRUCTURE FOR A SEMICONDUCTOR DEVICE WITH AN ISOLATING PROTECTIVE LAYER AND METHOD OF FABRICATING THE SAME

BACKGROUND OF THE INVENTION

Description of the Prior Art

The present invention relates to a semiconductor device and a method of fabricating the same, and more particularly to a semiconductor integrated circuit with an improved lead frame structure and a method of forming the same.

In recent years, high density integration of semiconductor integrated circuits and large scale integrated circuits has been on the increase. Packages of the semiconductor integrated circuits and large scale integrated circuits have also been scaled down with increased number of connection pins of the semiconductor integrated circuits. For those reasons, a pitch between the adjacent leads is made narrow. This tendency of such narrowed pitch between the leads is also present when the semiconductor chip is sealed with a mold resin. Such tendency of the narrowed pitch between the leads means a high possibility of formation of a short circuit between the adjacent leads by a slight displacement of the leads. In order to settle this problem, when the semiconductor chip is mounted with a sealing epoxy resin, leads of the lead frame are fixed with tapes. This lead frame is most popular and so called as a taping lead frame.

Figure 1A:
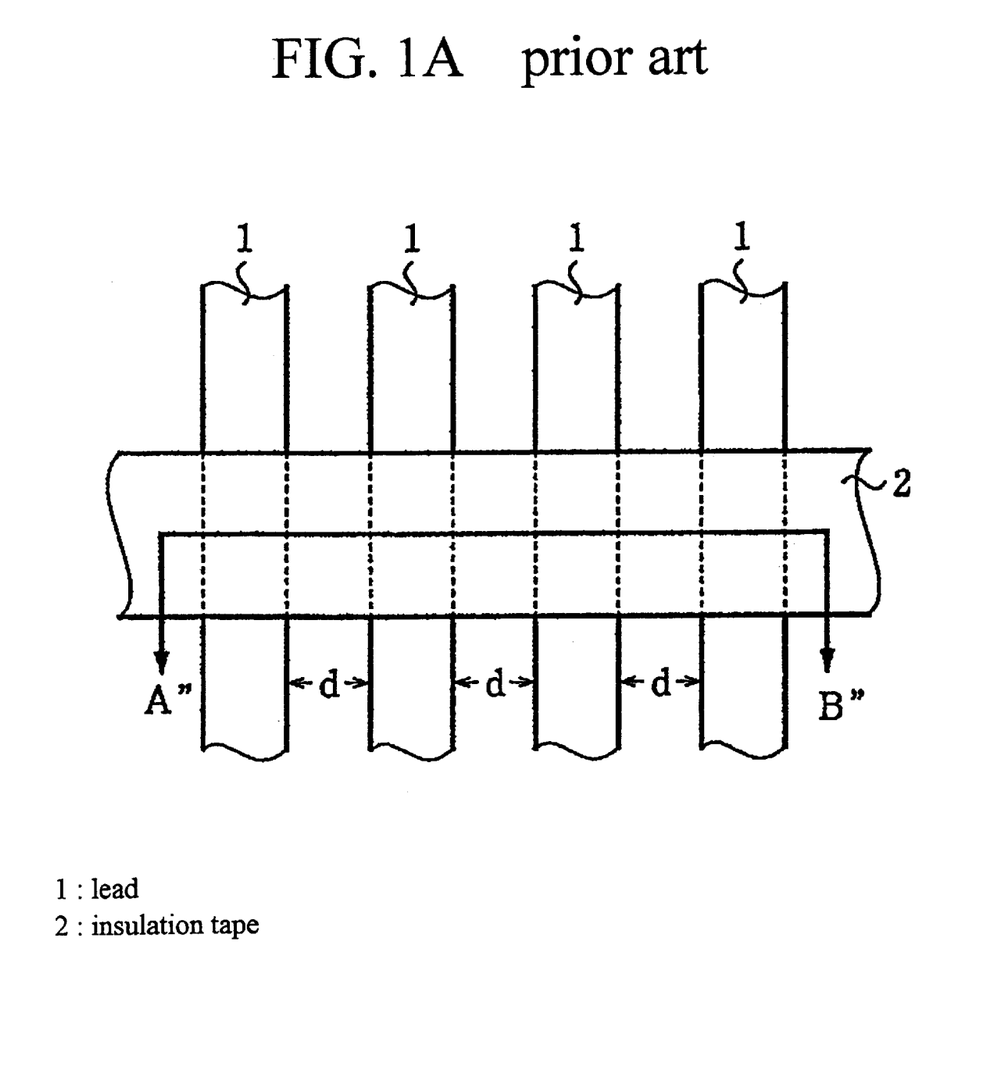
FIG. 1A is a fragmentary plane view illustrative of a conventional taping lead frame structure provided by a lead frame taping method.
Figure 1B:
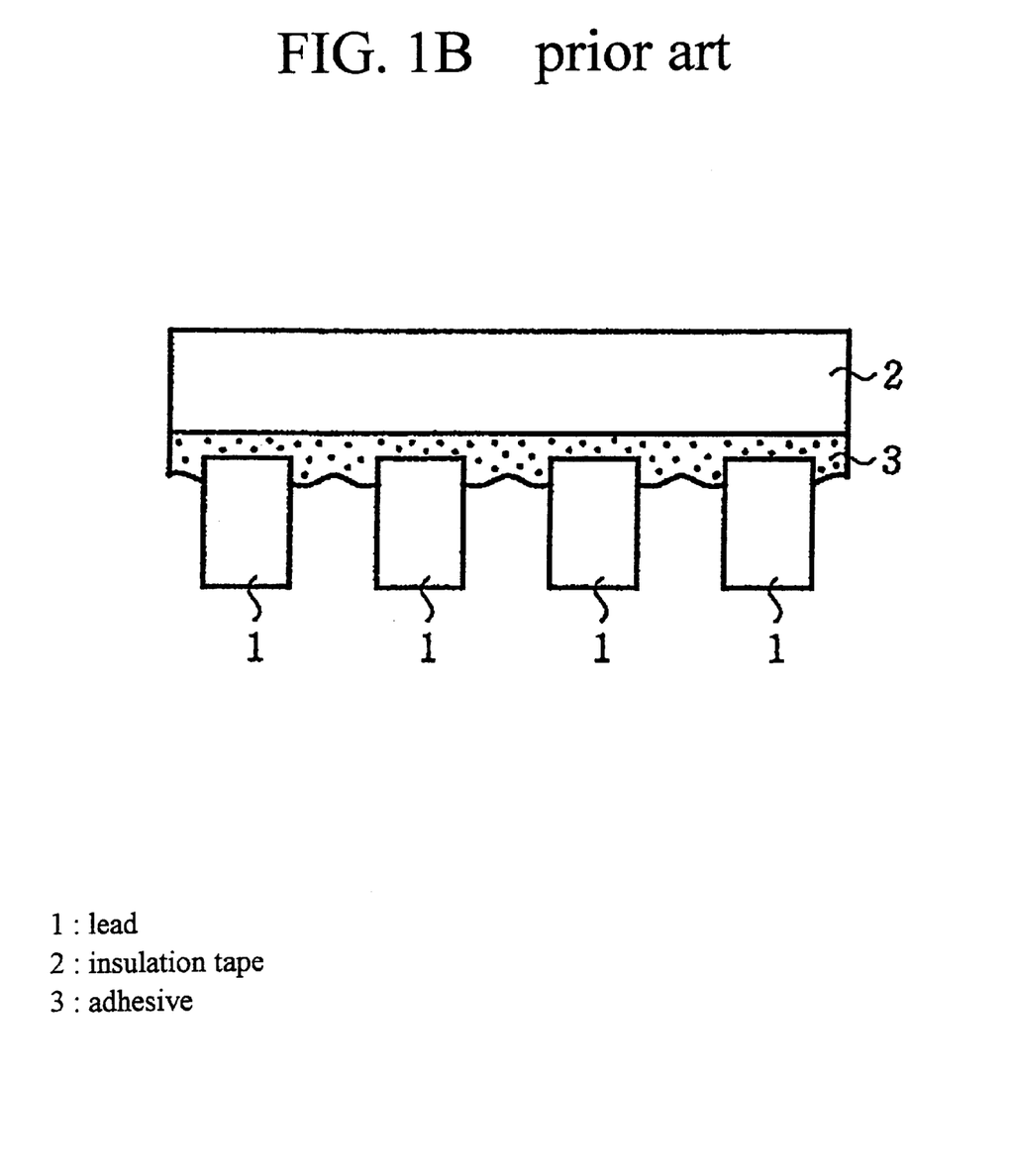
FIG. 1B is a fraginentary cross sectional elevation view taken along an A"–B" line of FIG. 1A and illustrative of a conventional taping lead frame structure provided by a lead frame taping method.

The conventional taping lead frame structure provided by a lead frame taping method will be described with reference to FIGS. 1A and 1B. FIG. 1A is a fragmentary plane view illustrative of a conventional taping lead frame structure provided by a lead frame taping method. FIG. 1B is a fragmentary cross sectional elevation view taken along an A"–B" line of FIG. 1A and illustrative of a conventional taping lead frame structure provided by a lead frame taping method.

An insulation tape 2 is provided which is adhered with an adhesive 3 to a plurality of leads 1 so that the insulation tape 2 extends cross the plural leads. Each of the leads 1 is made of Cu. A distance between adjacent leads 1 is 0.2 millimeters. The insulation tape 2 is made of an organic insulator such as polyimide. The adhesive 3 may be made of a mixture of NBR and phenol resin.

The adhesive 3 is applied entirely on one surface of the insulation tape 2 whilst the adhesive 3 is also in contact with the plural leads 1. Namely, the adhesive 3 is formed between the insulation tape 2 and the plurality of the leads 1, and also formed on between the insulation tape 2 and gaps of the plurality of the leads 1. The adhesive 3 is disposed between the adjacent leads 3, namely the adjacent leads 1 are connected through the adhesive 3 to each other. If a potential difference or a voltage is applied across the adjacent two leads 1, then the electrolytic action causes an ionization of Cu at an anode side before ionized Cu is moved through the adhesive 3 to a cathode side where a precipitation thereof appears Namely, a Cu ion migration appears. Finally, a large amount of Cu is precipitated whereby any short circuit may be formed between the adjacent two leads 1. Even if no short circuit is formed between the adjacent two leads 1, a leakage of current between the adjacent two leads 1 is increased.

In the Japanese laid-open patent publication No. 3-284868, it is disclosed to prevent the above ion migration of a plating material at bonding portions of the semiconductor device by changing the plating material into materials other than Cu. However, the bodies of the leads 1 are made of Cu and it is difficult to prevent the Cu ion migration from the Cu bodies of the leads 1.

In the above circumstances, it had been required to develop a novel semiconductor device with an improved lead frame structure which is capable of preventing Cu ion migrations between the leads.

SUMMARY OF THE INVENTION

Accordingly, it is an object of the present invention to provide a novel semiconductor device with an improved lead frame structure free from the above problems and disadvantages.

It is a further object of the present invention to provide a novel semiconductor device with an improved lead frame structure which is capable of preventing Cu ion migrations between the leads.

It is a still further object of the present invention to provide a novel semiconductor device with an improved lead frame structure which is capable of providing a high reliability.

It is another object of the present invention to provide a novel method of forming a semiconductor device with an improved lead frame structure free from the above problems and disadvantages.

It is still another object of the present invention to provide a novel method of forming a semiconductor device with an improved lead frame structure which is capable of preventing Cu ion migrations between the leads.

It is yet another object of the present invention to provide a novel method of forming a semiconductor device with an improved lead frame structure which is capable of providing a high reliability.

The above and other objects, features and advantages of the present invention will be apparent from the following descriptions.

The present invention embodiment provides a lead structure in a semiconductor device, comprising a body of a lead having at least a part which is in contact with an adhesive which bonds with an insulation tape, and a protection layer selectively provided on the body of the lead so that the protection layer coats at least the part of the body in contact with the adhesive whereby the protection layer completely isolates the body of the lead from the adhesive, thereby to prevent an ion migration of a material of the body and also prevent leakage of currents from and into the body of the lead.

The body of the lead may be made of copper.

The protection layer may comprise a metal film which is unlikely to be ionized in atmosphere. The metal film may be made of one selected from the group consisting of gold, platinum, palladium, indium, chromium, titanium, antimony, rhodium, tantalum or vanadium, or alloys based on those metals. The metal film may be formed by a plating method. The metal film may also be made of silver and formed by a plating method.

Alternatively, the protection layer may comprise a resin film. The resin film may have a poor hygroscopicity. The film may be made of one selected from the group consisting of acrylic resin, an urethane, silicone resin, epoxy resin and silicone gel.

The second present invention embodiment provides a taping lead frame structure in a semiconductor device, comprising a plurality of leads, an insulation tape extending across over the plurality of leads, an adhesive layer being provided between the plurality of leads and the insulation tape for bonding the plurality of leads with the insulation tape so that a part of each the leads is in contact with the adhesive, and a protection layer selectively provided on each of the leads so that the protection layer coats at least the part of the lead in contact with the adhesive whereby the protection layer completely isolates the lead from the adhesive, thereby to prevent an ion migration of a material of the leads and also prevent leakage of currents between the leads.

The body of the lead may be made of copper.

The protection layer may comprise a metal film which is unlikely to be ionized in atmosphere. The metal film may be made of one selected from the group consisting of gold, platinum, palladium, indium, chromium, titanium, antimony, rhodium, tantalum or vanadium, or alloys based on those metals. The metal film may be formed by a plating method. The metal film may also be made of silver and formed by a plating method.

Alternatively, the protection layer may comprise a resin film. The resin film may have a poor hygroscopicity. The film may be made of one selected from the group consisting of acrylic resin, an urethane, silicone resin, epoxy resin and silicone gel.

The third present invention embodiment provides a method of forming a metal plating layer selectively provided on a body of a lead so that the metal plating layer coats at least a part of the body in contact with an adhesive which bonds the lead to an insulation tape whereby the metal plating layer completely isolates the body of the lead from the adhesive, thereby to prevent an ion migration of a material of the body and also prevent leakage of currents from and into the body of the lead. The method comprises a single step of selectively subjecting the part of the lead to a plating of a metal which is unlikely to be ionized in atmosphere at the same time when a tape lead frame is formed thereby to form the metal plating layer.

The fourth present invention embodiment provides a method of forming a coating resin layer selectively provided on a body of a lead so that the coating resin layer coats at least a part of the body in contact with an adhesive which bonds the lead to an insulation tape whereby the coating resin layer completely isolates the body of the lead from the adhesive, thereby to prevent an ion migration of a material of the body and also prevent leakage of currents from and into the body of the lead. The method comprises a single step of selectively coating the part of the lead with a resin which has a poor hygroscopicity at the same time when a tape lead frame is formed thereby to form the coating resin layer.

BRIEF DESCRIPTION OF THE DRAWINGS

Preferred embodiments according to the present invention will be described with reference to the accompanying drawings.

PREFERRED EMBODIMENTS
FIRST EMBODIMENT

Figure 2A:
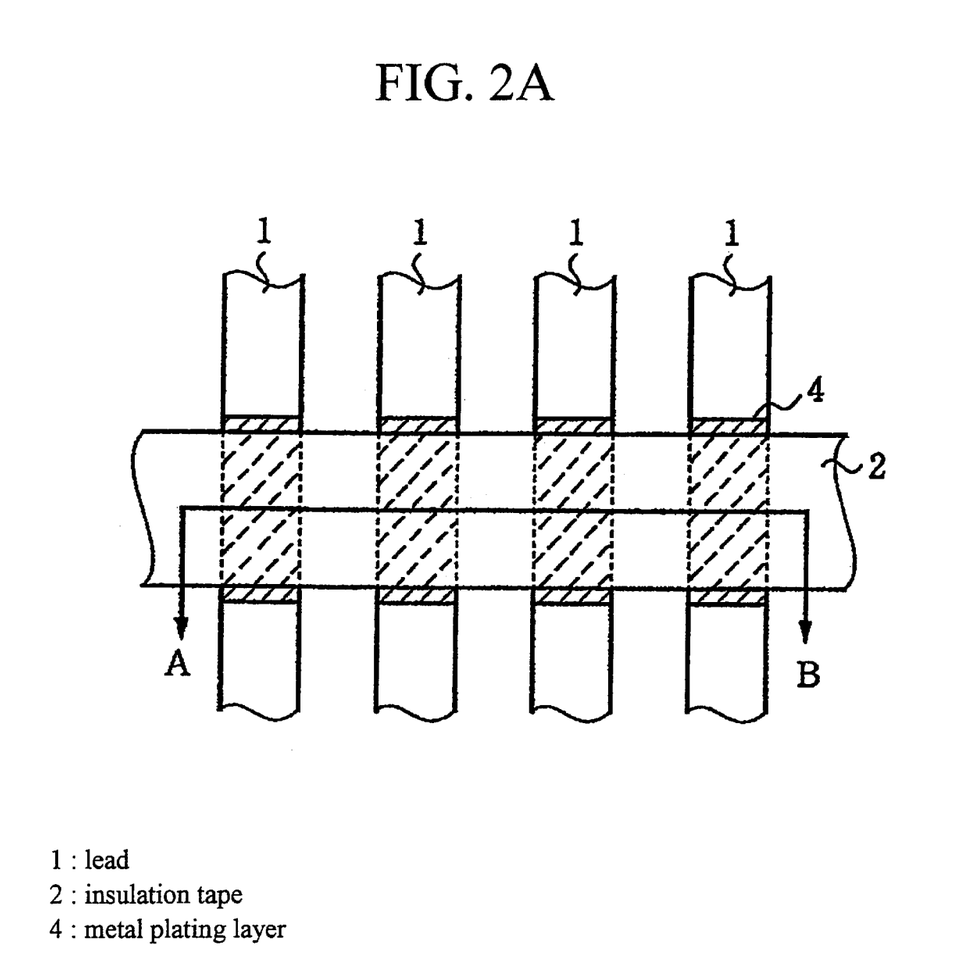
FIG. 2A is a fragmentary plane view illustrative of a novel taping lead frame structure provided by a lead frame taping method in a first embodiment in accordance with the present invention.
Figure 2B:
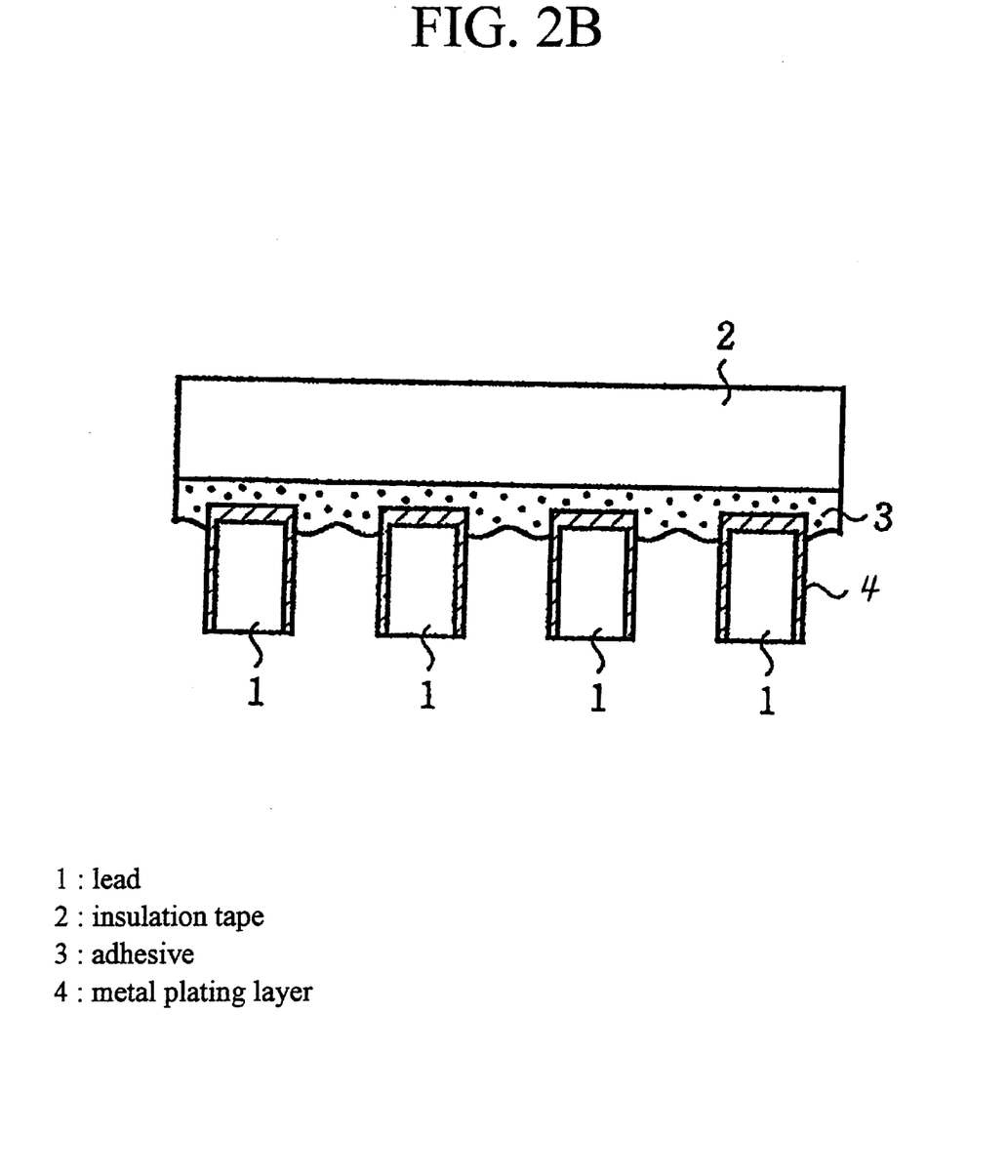
FIG. 2B is a fragmentary cross sectional elevation view taken along an A"–B" line of FIG. 2A and illustrative of a novel taping lead frame structure provided by a lead frame taping method in a first embodiment in accordance with the present invention.

A first embodiment according to the present invention will be described, wherein a novel taping lead frame structure provided by a lead frame taping method will be described. FIG. 2A is a fragmentary plane view illustrative of a novel taping lead frame structure provided by a lead frame taping method. FIG. 2B is a fragmentary cross sectional elevation view taken along an A–B line of FIG. 2A and illustrative of a novel taping lead frame structure provided by a lead frame taping method. An insulation tape 2 is provided which is adhered with an adhesive 3 to a plurality of leads 1 so that the insulation tape 2 extends cross the plural leads. Each of the leads 1 is made of Cu. The insulation tape 2 is made of an organic insulator such as polyimide. The insulation tape 2 has a thickness of about 100 micrometers. The adhesive 3 may be made of a mixture of NBR and either phenol resin or imide resin. The adhesive 3 has a thickness of about 50 micrometers. The adhesive 3 is applied entirely on one surface of the insulation tape 2 whilst the adhesive 3 is also in contact with the plural leads 1. Namely, the adhesive 3 is formed between the insulation tape 2 and the plurality of the leads 1, and also formed on between the insulation tape 2 and gaps of the plurality of the leads 1. The adhesive 3 is disposed between the adjacent leads 3. However, each of the leads 1 is partially coated with a metal plating film 4. Namely, a part of the each lead 1 over which the insulation tape 2 is adhered is coated with the metal plating film 4 so that the each lead 1 is contact via the metal plating film 4 with the adhesive 3. The metal plating film 4 is made of a metal which is capable of suppressing ion migration in atmosphere. For example, the metal plating film 4 may be made of gold, platinum, palladium, indium, chromium, titanium, antimony, rhodium, tantalum or vanadium, or alloys based on those metals Also the metal plating film 4 may be made of a metal which is capable of preventing metal ions from moving into the adhesive 3, for example, silver. The metal plating film 4 may have a thickness of about 30 micrometers.

The above metal plating films 4 may be made at the same time when bonding areas are formed by an electroplating method by changing a mask. The metal plating film 4 may be made of a metal capable of gold, platinum, palladium, indium, chromium, titanium, antimony, rhodium, tantalum or vanadium, or alloys based on those metals. In view of the low cost, silver is the best metal for the metal plating film 4 as being the same metal of the bonding area. Silver is capable of preventing metal ions from moving into the adhesive 3. Similarly to Cu, the silver "Ag" is likely to be ionized and is the metal with a low resistive to the ion-migration. But the silver has a larger atomic mass than Cu, for which reason ionized silver is unlikely to move through the adhesive 3 as compared to the ionized Cu. Thus, if silver is used for the metal plating film 4, then it is possible to reduce the probability of formation of the short circuit between the adjacent leads and reduce the leakage of a current between the adjacent leads rather when Cu is used for the metal plating film 4. The metal plating film 4 may have a thickness of about 30 micrometers. In the actual acceleration evaluation made under 140° C./85%/500H and 85° C./85%/3000H, no ion migration of silver appears.

It is possible that the plating area for formation of the plating metal separately from the bonding area or also possible to widen the bonding area for common use of the bonding area with the taping area.

As described above, the metal plating film 4 is provided to isolate the Cu body of the leads 1 from the adhesive 3. The metal plating film 4 is made of a metal which is capable of suppressing Cu ion migration between the Cu bodies of the leads 1. For example, the metal plating film 4 may be made of gold, platinum, palladium, indium, chromium, titanium, antimony, rhodium, tantalum or vanadium, or alloys based on those metals. Also the metal plating film 4 may be made of a metal which is capable of preventing metal ions from moving into the adhesive 3, for example, silver. Similarly to Cu, silver "Ag" is likely to be ionized and is the metal with a low resistive to the ion-migration. But silver has an atomic mass larger by about two times than Cu, for which reason ionized silver is unlikely to move through the adhesive 3 as compared to the ionized Cu. Thus, if silver is used for the metal plating film 4, then it is possible to reduce the probability of formation of the short circuit between the adjacent leads and reduce the leakage of a current between the adjacent leads rather when Cu is used for the metal plating film 4. If epoxy resin is used for the resin sealing semiconductor device, then no ion migration appears in the epoxy resin. For this reason, it is possible to prevent Ag ion migration by using the epoxy resin.

SECOND EMBODIMENT

Figure 3A:
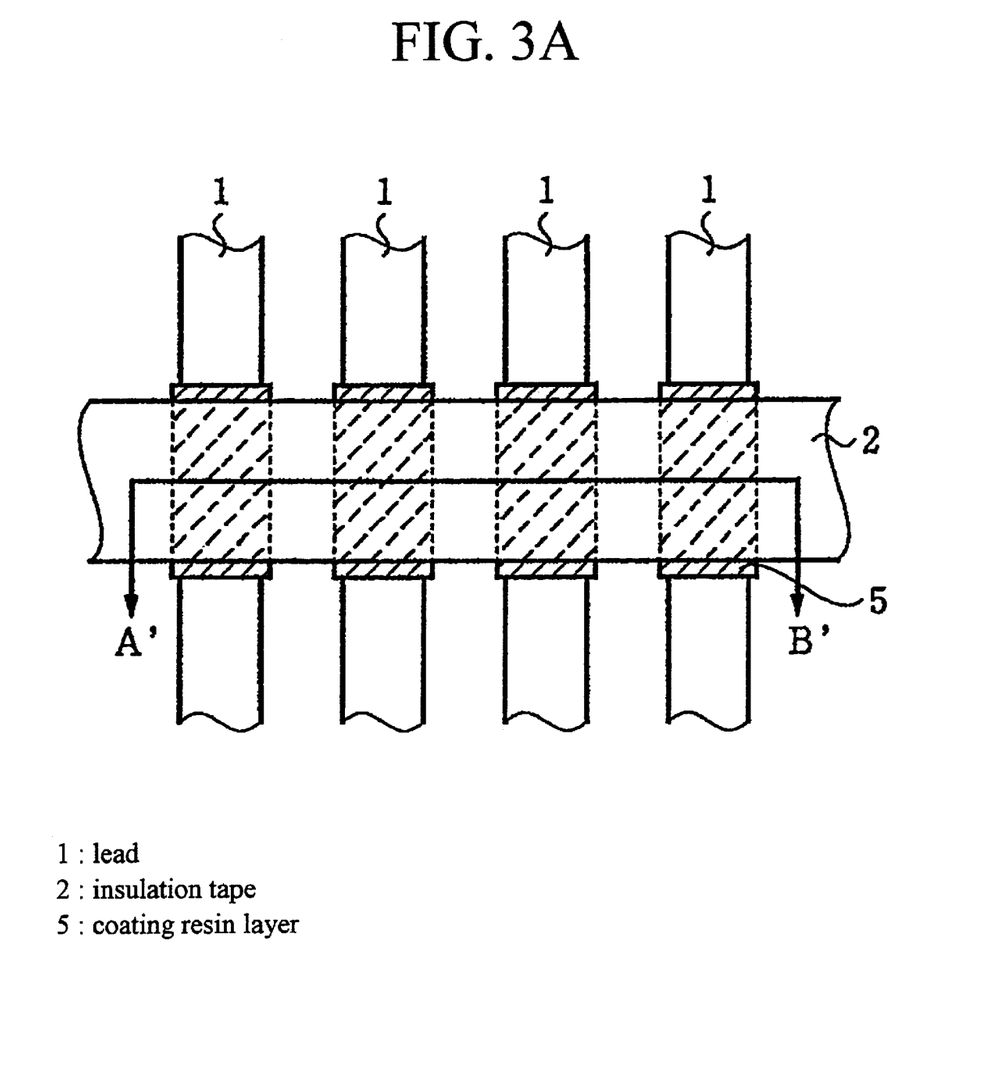
FIG. 3A is a fragmentary plane view illustrative of a novel taping lead frame structure provided by a lead frame taping method in a second embodiment in accordance with the present invention.
Figure 3B:
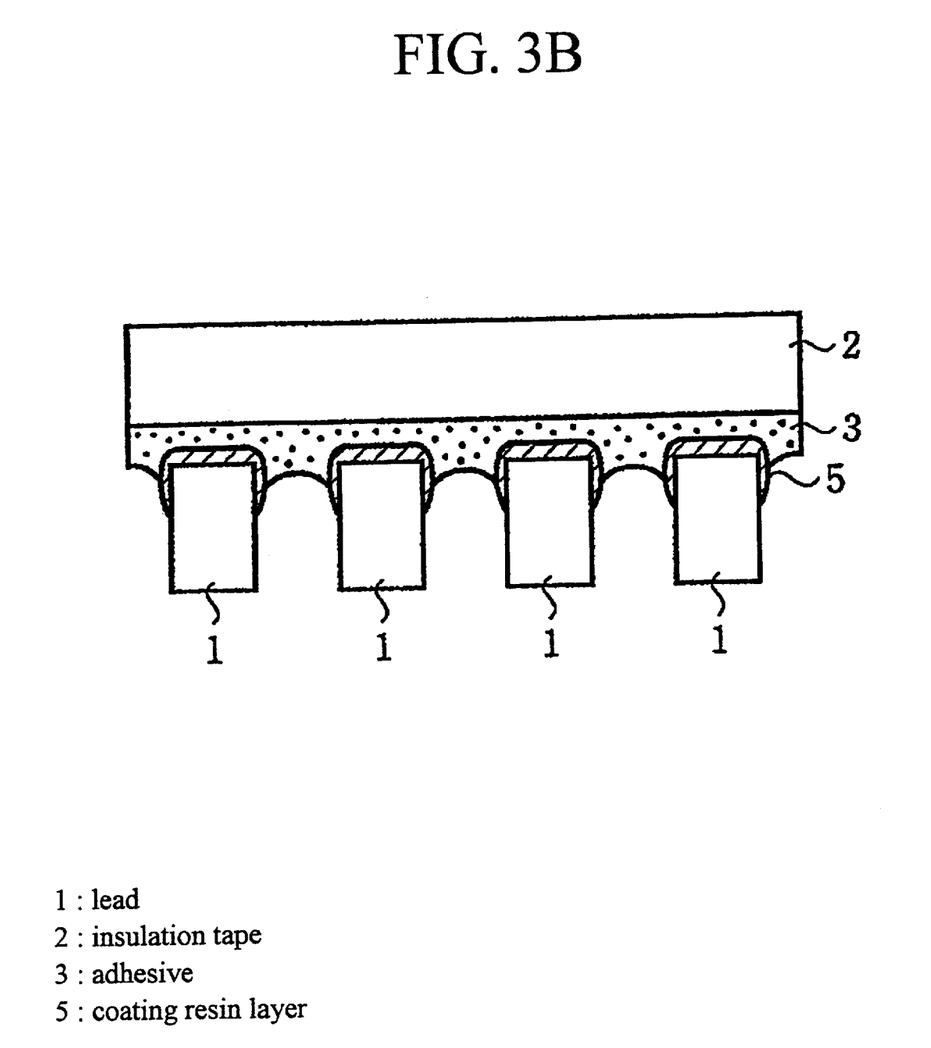
FIG. 3B is a fragmentary cross sectional elevation view taken along an A'–B' line of FIG. 3A and illustrative of a novel taping lead frame structure provided by a lead frame taping method in a second embodiment in accordance with the present invention.

A second embodiment according to the present invention will be described, wherein a novel taping lead frame structure provided by a lead frame taping method will be described. FIG. 3A is a fragmentary plane view illustrative of a novel taping lead frame structure provided by a lead frame taping method. FIG. 3B is a fragmentary cross sectional elevation view taken along an A–B line of FIG. 3A and illustrative of a novel taping lead frame structure provided by a lead frame taping method. An insulation tape 2 is provided which is adhered with an adhesive 3 to a plurality of leads 1 so that the insulation tape 2 extends cross the plural leads. Each of the leads 1 is made of Cu. The insulation tape 2 is made of an organic insulator such as polyimide. The insulation tape 2 has a thickness of about 100 micrometers. The adhesive 3 may be made of a mixture of NBR and either phenol resin or imide resin. The adhesive 3 has a thickness of about 50 micrometers. The adhesive 3 is applied entirely on one surface of the insulation tape 2 whilst the adhesive 3 is also in contact with the plural leads 1. Namely, the adhesive 3 is formed between the insulation tape 2 and the plurality of the leads 1, and also formed on between the insulation tape 2 and gaps of the plurality of the leads 1. The adhesive 3 is disposed between the adjacent leads 3. However, each of the leads 1 is partially coated with a coating resin film 5. Namely, a part of the each lead 1 over which the insulation tape 2 is adhered is coated with the coating resin film 5 so that the each lead 1 is contact via the coating resin film 5 with the adhesive 3. The coating resin film 5 is made of acrylic resin, urethane, silicone resin, epoxy resin and silicone gel which have poor hygroscopicity. The coating resin film 5 may be made by application of the resin by about 20 micrometers on the each lead 1 for subsequent thermosetting at 200° C. for two hours.

The coating resin film 5 is provided to isolate the Cu body of the leads 1 from the adhesive 3. The coating resin film 5 is capable of suppressing Cu ion migration between the Cu bodies of the leads 1 or leakage of the current between the leads 1.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A lead structure in a semiconductor device, comprising:
   a body of a lead having at least a part which is in contact with an adhesive which bonds with an insulation tape; and
   a protection layer selectively provided on said body of said lead and contacting said adhesive of said insulation tape so that said protection layer coats at least said part of said body in contact with said adhesive, said protection layer having a thickness which completely isolates said body of said lead from said adhesive to prevent an ion migration of a material of said body and also to prevent leakage of currents from and into said body of said lead,
   wherein said protective layer comprises a metal film which is unlikely to be ionized in atmosphere and wherein said metal film is made of one selected from the group consisting of gold, platinum, palladium, indium, chromium, titanium, antimony, rhodium, tantalum and vanadium, and alloys based on those metals.

2. The lead structure as claimed in claim 1, wherein said body of said lead is made of copper.

3. The lead structure as claimed in claim 1, wherein said metal film is formed by a plating method and wherein said thickness is approximately 30 micrometers.

4. A lead structure in a semiconductor device, comprising:
   a body of a lead having at least a part which is in contact with an adhesive which bonds with an insulation tape; and
   a protection layer selectively provided on said body of said lead and contacting said adhesive of said insulation tape so that said protection layer coats at least said part of said body in contact with said adhesive, said protection layer having a thickness which completely isolates said body of said lead from said adhesive to prevent an ion migration of a material of said body and also to prevent leakage of currents from and into said body of said lead,
   wherein said protection layer comprises a resin film and wherein said thickness is approximately 20 micrometers.

5. The lead structure as claimed in claim 4, wherein said resin film has a poor hygroscopicity.

6. The lead structure as claimed in claim 5, wherein said film is made of one selected from the group consisting of acrylic resin, an urethane, silicone resin, epoxy resin and silicone gel.

7. A taping lead frame structure in a semiconductor device, comprising:
   a plurality of leads;
   an insulation tape extending across over said plurality of leads;
   an adhesive layer being provided between said plurality of leads and said insulation tape for bonding said plurality of leads with said insulation tape so that a part of each of said leads is in contact with said adhesive; and a protection layer selectively provided on each of said leads and contacting said adhesive of said insulation tape so that said protection layer coats at least said part of said lead in contact with said adhesive, said protection layer having a thickness which completely isolates said lead from said adhesive, thereby to prevent an ion migration of a material of said leads and also to prevent leakage of currents between said leads, wherein said protection layer comprises a resin film and wherein said thickness is approximately 20 micrometers.

8. The lead structure as claimed in claim 7, wherein said resin film has a poor hygroscopicity.

9. The lead structure as claimed in claim 8, wherein said film is made of one selected from the group consisting of acrylic resin, an urethane, silicone resin, epoxy resin and silicone gel.

* * * * *